Figure 1:
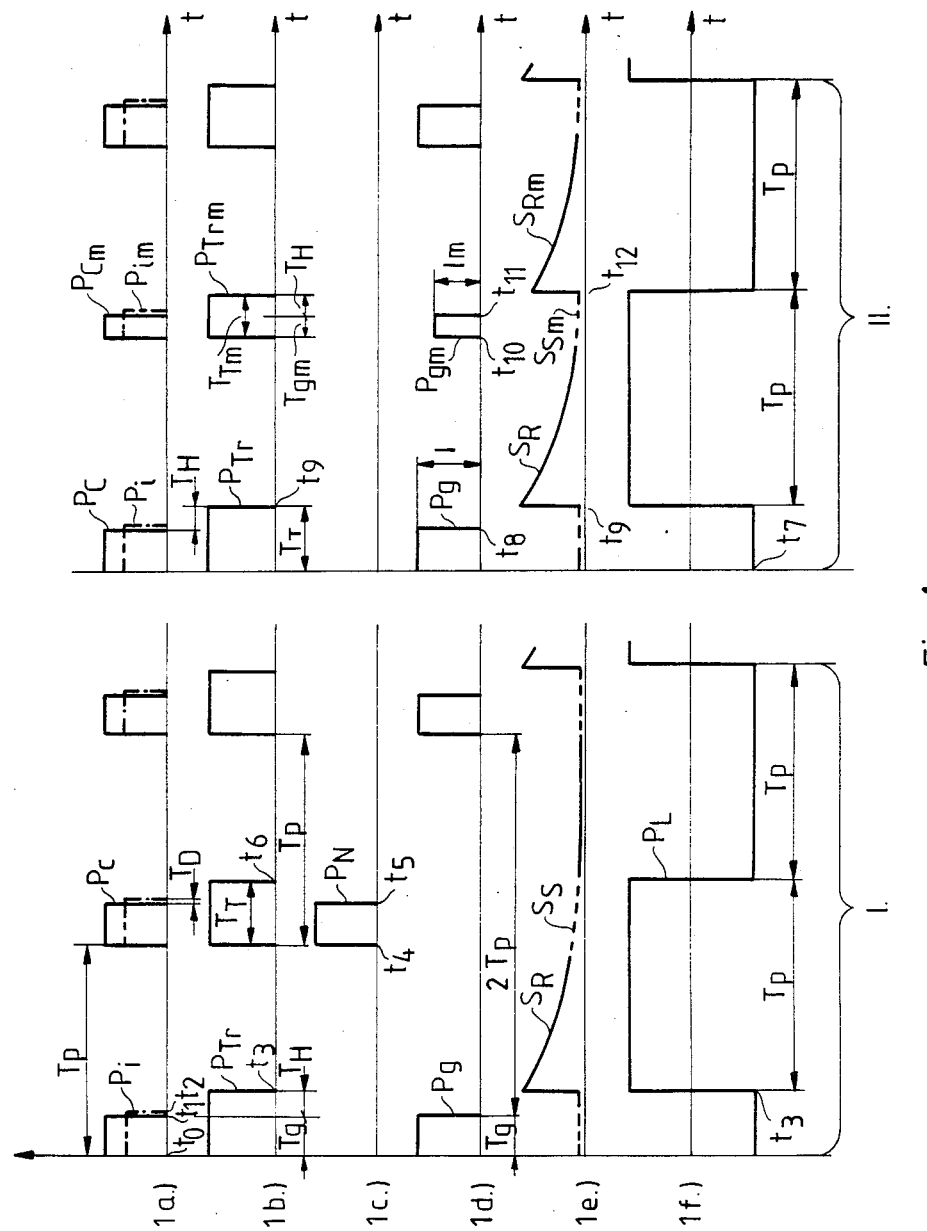

United States Patent [19]

Ferenczi et al.

[11] Patent Number: 4,571,541

[45] Date of Patent: Feb. 18, 1986

[54] METHOD FOR DETERMINING CHARGED ENERGY STATES OF SEMICONDUCTOR OR INSULATOR MATERIALS BY USING DEEP LEVEL TRANSIENT SPECTROSCOPY, AND AN APPARATUS FOR CARRYING OUT THE METHOD

[75] Inventors: György Ferenczi; János Boda; Ferenc Tóth; Peter Horváth, all of Budapest; László Benkovics, Dunakeszi; László Dózsa, Érd, all of Hungary

[73] Assignee: Magyar Tudományos Akadémia Müszaki Fizikai Kutató Intézete, Budapest, Hungary

[21] Appl. No.: 439,226

[22] Filed: Nov. 4, 1982

[30] Foreign Application Priority Data

Nov. 9, 1981 [HU] Hungary ............... 3342/81

[51] Int. Cl.$^4$ ........................... G01R 31/26
[52] U.S. Cl. ..................... 324/158 D; 324/158 R
[58] Field of Search ........... 324/158 D, 158 T, 158 R, 324/60 C

[56] References Cited

U.S. PATENT DOCUMENTS 3,859,595 1/1975 Lang ................. 324/158 D
4,437,060 3/1984 Ferenczi et al. ........... 324/158 D

OTHER PUBLICATIONS

Journal of Applied Physics, Lang, D. V., "Fast Capacitance Transient Apparatus . . . ", vol. 45, No. 7, Jul. 1974, pp. 3014–3022.
Applied Physics, Lefevre, H., and Schulz, M., "Double Correlation Technique . . . ", vol. 12, No. 1, Jan. 1977, pp. 45–53.
IEEE Transaction on Electron Devices, Borsuk, J. A., and Swanson, R. M., "Current Transient Spectroscopy . . . ", vol. ED-27, No. 12, Dec. 1980, pp. 2217–2225.
Solid State Electronics, Crowell, C. R., and Alipanahi, S., "Transient Distortion and nth Order Filtering . . . ", vol. 24, Jan. 1981, pp. 25–36.

*Primary Examiner*—Stewart J. Levy
*Assistant Examiner*—Stephen M Baker
*Attorney, Agent, or Firm*—Toren, McGeady, Stanger, Goldberg & Kiel

[57] ABSTRACT

A method for determining charged energy states of a sample of a semiconductor or insulator material by using deep level transient spectroscopy. The method includes the steps of exciting the sample by application of periodical exciting pulses to change the initial charge state, detecting the transient response of the sample when it returns to the thermodynamical balance condition following the termination of each of the excitation pulses, blocking the detection during a blocking period defined as the combined existence of the exciting pulses and of a dead period including the recovery period of the means used for the detection, performing a weighted integration operation on a detected response signal by the application of a symmetrical square wave synchronizing pulse as a weighting function synchronized to the frequency of said exciting pulses, blocking the detection in each of said detecting periods for the duration of a further blocking period which begins in a moment defined between the starting moments of the two exciting pulses immediately preceding and following said detecting period and synchronizing the synchronizing pulses to terminating moments of said dead periods to have a period time which is equal to the period time of said periodical exciting pulses. Apparatus for carrying out the method is also disclosed.

12 Claims, 2 Drawing Figures

METHOD FOR DETERMINING CHARGED ENERGY STATES OF SEMICONDUCTOR OR INSULATOR MATERIALS BY USING DEEP LEVEL TRANSIENT SPECTROSCOPY, AND AN APPARATUS FOR CARRYING OUT THE METHOD

FIELD OF THE PRESENT INVENTION

The invention relates to a method for determining charged energy states of semiconductor or insulator materials by using deep level transient spectroscopy widely referred to as the DLTS technique.

The invention relates also to an apparatus for carrying out a method which can perform DLTS measurements.

BACKGROUND OF THE INVENTION

The determination of charged energy states of semiconductor and insulator materials, especially of oxide layers on semiconductors, forms a basic task of semiconductor research and production, since the energy states (the deep levels) substantially determine the properties of semiconductor devices. The first widely accepted method for the quick examination of deep levels was proposed by D. V. Lang (J. Appl. Phys. 45, pp. 3023–3032, 1974) and he called his method deep level transient spectroscopy or in short as DLTS method. This method was used in its first implementation for detecting transient capacitances, and later B. W. Wessels also proposed (J. Appl. Phys. 47, pp. 1131–1133, 1976) the DLTS measurement of current transients. The principial identity of these two methods was disclosed by J. A. Borsuk and R. M. Swansen (IEEE Trans. Electron. Dev. ED-27, pp. 2217–2225, 1980), and it was stated that there is no inherent advantage in the use of either current or capacitance transients.

In the original Lang method, a double boxcar integrator was used for averaging the transient signals. For improvement of this method, L. C. Kimerling (IEEE Trans. Nucl. Sci. NS-23, 1976) first proposed the usage of a lock-in amplifier for signal averaging. In principle, the lock-in amplifier can provide a better signal to noise ratio, however, in the particular application suggested by that paper, its accuracy and reliability has not yet been satisfactory. The analysis of the problems was disclosed by D. S. Day et al. (J. Appl. Phys. 50, pp. 5093–5096, 1979).

For increasing the accuracy, a special timing and the usage of a wideband synchronous detector (lock-in amplifier) has been proposed by the present applicant in U.S. Pat. No. 4,437,060.

In order that the measurements carried out with different repetition frequencies be comparable with each other, in this Patent, a phase adjustment was used which is independent of the repetition frequency of the exciting pulses. The passage of the measuring signal was blocked during the existence of the exciting pulses and of a dead period corresponding to a frequency-independent phase-angle, and the squarewave of the lock-in amplifier was synchronized to the terminating moments of the dead periods. The length of the dead period was adjusted depending on the time required for the decaying of the switching transients of the measuring unit. According to the considerations disclosed in that publication, the length of the dead period had to be about fifteen times greater that the response time of the measuring unit (detector), because in such a period the transients would decay to $10^{-5}$ times the original value. The required accuracy could be reached only by such a long waiting time.

If it is taken into account that the duration of switching transients (the response time of the detector) is typically 5 $\mu$s, then the minimum value for the dead period was 75 $\mu$s. For obtaining the required accuracy, the combined duration of an exciting pulse and of the dead period can not be longer than 10% of the repetition period of the exciting pulses, therefore, the repetition period of the exciting pulses can not be shorter than 750 $\mu$s even if indefinitely short exciting pulses are chosen. With practical pulse-lengths, the minimum repetition period time was about 1 ms. Due to practical considerations, the period time of the exciting pulses can not be longer than about 1 s, and with these limit values, the possible range of adjustment of the period time of the exciting pulses will not be greater than three decimal orders of magnitude. This range of adjustment is required for determining the temperature dependence of activation energy. For widening the scale of measurements, the increase of this range of adjustment has an outstanding significance.

A different method has been proposed by M. Schulz and H. Lefevre in German Pat. No. 2.631.783 (Appl. Phys. 12, pp. 45–53, 1977) which can be regarded as a special improvement of the averaging by a boxcar amplifier and this is called the double correlation DLTS method or in short as the DDLTS method. The essence of the double correlation DLTS method of Schulz et. al. lies in the application of two exciting pulses with different shapes, and, following these exciting pulses, respective samples are taken in two different moments from the transient capacitance signals by using the well known Lang's method. The sign of the sampling pulses are different and the sign-order is inverted following the respective exciting pulses.

In contrast to the original Lang method, the DDLTS technique is less sensitive to DC offset drifts and it facilitates the determination of the profile of the spatial distribution of deep levels. The comparison of various correlation methods has been disclosed by C. R. Crowell et. al. in Solid State Electronics Vol. 24. pp. 25–36, 1981. It should be noted that for the implementation of the DDLTS method, an apparatus is required which is different from those used for the DLTS technique.

In the DDLTS method as proposed by Schulz et. al., the time windows used for the sampling pulses take only a small fraction of the time elapsed between subsequent exciting pulses, and from this it follows that the signal to noise ratio of this method is less preferable. For performing double correlation, specially designed multichannel analog processing circuits are required. The application of a large number of analog circuits decreases the signal to noise ratio and, in this way, the sensitivity. With such an apparatus, capacitance transients smaller than $10^{-3}$ pF can not be detected.

The object of the invention is to provide a method by which an increased signal to noise ratio and a higher sensitivity can be reached during the usage of the DLTS technique and which enables the performance of all examinations that have been limited to the DDLTS technique so far.

A further object of the invention lies in the provision of a comparatively simple apparatus for carrying out the method.

SUMMARY OF THE INVENTION

According to the invention a method has been provided for determining charged energy states of a sample of a semiconductor or insulator material by using deep level transient spectroscopy, in which the sample is excited by the application of periodical exciting pulses to change the initial charge state thereof and the transient response of the sample is detected when it returns to the thermodynamical equilibrium state following the termination of each of the excitation pulses, the detection is blocked during a blocking period defined as the combined existence of the exciting pulses and of a dead period which latter includes the recovery period of the means used for the detection, a weighted integration operation is carried out on a detected response signal by the application of a symmetrical synchronizing pulse as a weighting function synchronized to the frequency of the exciting pulses, in which according to the invention the improvement lies in that the detection process is blocked in each of the detecting periods for the duration of a further blocking period which begins in a moment defined between the starting moments of the two exciting pulses immediately preceding and following that detecting period, the synchronizing pulses are synchronized to terminating moments of the dead periods to have a period time which is equal to the period time of the periodical exciting pulses.

In accordance with the DLTS technique, in a measurement cycle the temperature of the sample is changed continuously with constant frequency of the exciting pulses, or the exciting frequency is changed with constant sample temperature.

By the method according to the invention, the blocking periods and the transient processes associated therewith are generated with a double frequency compared to the frequency of the exciting pulses and of the weighting pulses. By means of the application of the specific weighting function defined hereinabove, the effects of the transient processes in the respective detecting half-periods offset each other which results in a number of advantages.

For ensuring the continuity of the detected response signal in the blocking periods, this signal is substituted by a simulated signal for the weighted integration operation which has a value equal to that of the detected response signal immediately preceding the starting moment of the blocking period.

It is advantageous according to the invention if the sample is excited by second type exciting pulses during the further blocking periods occurring between the first exciting pulses, and the second type exciting pulses have a different intensity and/or duration than the first exciting pulses have.

Resulting from the combined effect of the series of the first type exciting pulses and of the second type exciting pulses therebetween, not only the switching and blocking operations occur with double frequency relative to the weighting function but the exciting will also be doubled, however, the frequency of an exciting pulse series of a given type is always equal to that of the weighting function.

In this embodiment of the method, a differential DLTS method is performed, which provides all examination possibilities that the DDLTS method does, however, with increased sensitivity and with less sophisticated instrumentation.

It is preferable if the length of the further blocking periods is adjusted to the combined duration of the second type exciting pulses and of the dead period, and the second type exciting pulses are synchronized to the synchronizing pulses in such a way that the terminating moments of the dead periods following each second type exciting pulse coincide with moments when the sign of the synchronizing pulses is changed.

According to the invention an apparatus has also been provided for carrying out the method, in which the difference compared to the U.S. Pat. No. 4,437,060 lies in that it comprises a frequency divider with a dividing ratio of 1:2 and the input of the divider is coupled to a control unit which delivers clock pulses synchronized to the end moments of the dead periods, the output of the divider is coupled to a reference input of a synchronous detector implemented preferably by a lock-in amplifier, and the control unit comprises an output coupled to an inhibiting input of the exciter to block the generation of every second exciting pulse.

For performing a differential DLTS method, the exciter comprises a pair of pulse generators, the first pulse generator has inputs for receiving those outputs of the control unit which control the generation and inhibition of the first type exciting pulses, and the second pulse generator has an input for triggering the generation of the second type exciting pulses which is coupled to a further output of the control unit to determine the occurrence of the triggering moments.

Figure 2:
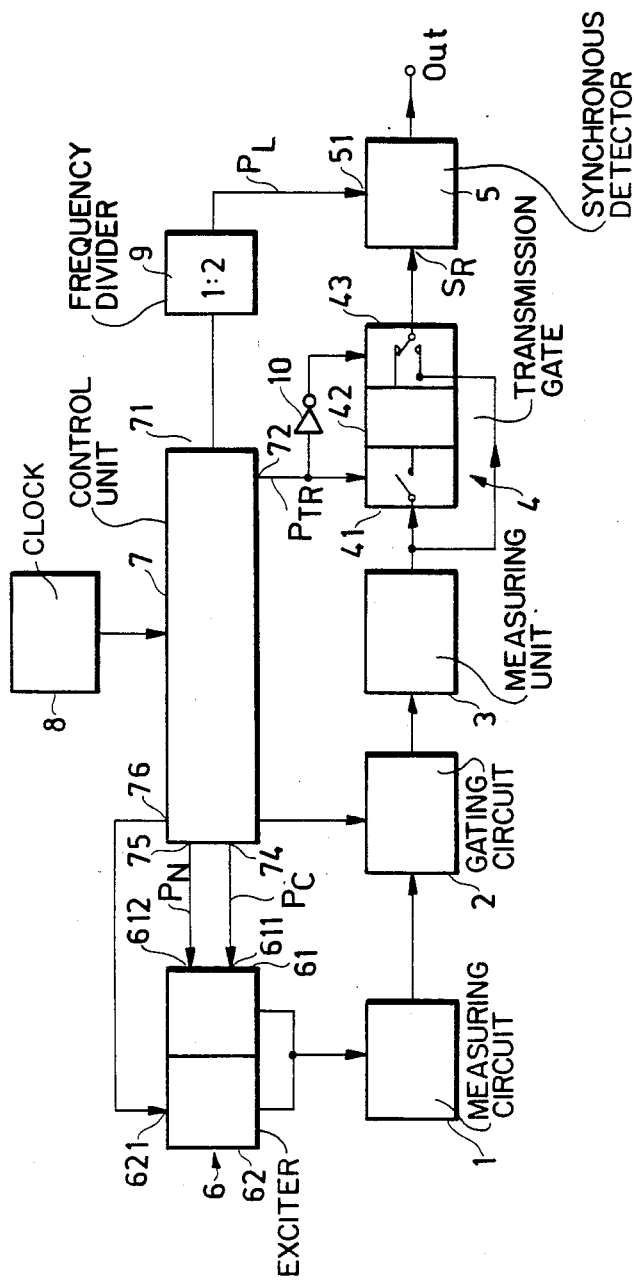

The invention will now be described by preferable embodiments thereof, in which reference will be made to the accompanying drawings. In the drawing:

FIG. 1 shows the timing diagrams of the various signals and pulses used during the method according to the invention, and FIG. 2 shows the general block diagram of the apparatus according to the invention for carrying out the method.

According to the known DLTS technique, a sample is taken from the semiconductor material which has to be examined, and the charge states of the energy levels of the sample are changed periodically. The periodical changing of the charge states can be achieved by means of different ways. If the sample is represented by a P-N junction which is similar to a diode, then a voltage pulse can be used for excitation which decreases the reverse bias of the sample. The charge states of the sample can also be changed by the application of a current pulse that injects both types of carriers. Instead of a current pulse, similar effects can be obtained by means of a light pulse or by the pulsated application of any other ionizating radiation (e.g. of an electron beam or of a gamma radiation) that can create electrons and holes in the sample.

During the presence of the exciting (injecting) pulses, the capacitance of the sample or the current flowing therethrough will change substantially.

In order to be able to detect the response of the sample after the termination of the exciting pulse, the sample is coupled in a measuring circuit which is coupled to the input of a measuring unit. The measuring unit can be realized both by a capacitance meter and by a current meter. FIG. 2 shows the block diagram of this conventional arrangement which is complemented with some novel elements according to the invention. In the conventional part of FIG. 2, measuring circuit 1 is coupled through a gating circuit 2 to the input of measuring unit 3. The output of the measuring unit 3 is coupled through transmission gate 4 to an input of synchronous detector 5. The measuring circuit 1 is driven by exciter 6. The operation of the exciter 6, the gating circuit 2, the transmission gate 4 and of the synchronous detector 5 is controlled by appropriate control pulses of control unit 7 driven by clock 8. The specific way of operation will be explained on the basis of timing diagrams of FIG. 1. A more detailed description of the arrangement will be given following the discussion of the principles of operation.

Reference is made now to FIG. 1 in which diagram 1a. shows control pulses $P_c$ which control the operation of the exciter 6. The control pulses $P_c$ are used for the generation of exciting pulses $P_g$ shown in diagram 1d. The control pulses $P_c$ have a repetition period $T_p$ and each pulse has a duration $T_g$. The first control pulse $P_c$ is started in moment $t_o$ and it is terminated in moment $t_1$. The exciting pulses $P_g$ (diagram 1d.) coincide with the control pulses $P_c$ i.e. they have respective durations $T_g$ and both their starting and terminating moments are identical with corresponding moments of the control pulses $P_c$. The difference between the exciting and control pulses $P_g$ and $P_c$ lies in that the repetition period of the exciting pulses $P_g$ is twice as long as that of the control pulses $P_c$. This means that every second control pulse $P_c$ can not generate a corresponding exciting pulse $P_g$.

Diagram 1c. shows a blocking pulse $P_N$ that impedes the effect of the control pulse $P_c$ to generate an exciting pulse in moment $t_4$, whereby no exciting pulse will be started in the moment $t_4$. It should be emphasised that the blocking pulse $P_N$ has been illustrated as a separate pulse for the sake of better understanding only, since appropriate circuits can easily block the effect of every second control pulse $P_c$ to generate an exciting pulse, and there is no need for the actual application of the blocking pulses $P_N$.

In diagram 1a. the dot-dash line illustrates isolating pulses $P_i$ which isolate the input of the measuring unit 3 from the output of the measuring circuit 1. The isolating pulses $P_i$, which control the gating circuit 2, substantially coincide with the control pulses $P_c$, and the difference lies in that their rear edges e.g. in the moment $t_2$ are slightly delayed compared to the rear edges of the control pulses $P_c$ e.g. in the moment $t_1$. This delay is not more than some tens of nanoseconds and it has the purpose of ensuring that the output of the measuring circuit 1 can be coupled to the input of the measuring unit 3 in moments (like $t_2$) when the corresponding exciting pulse $P_c$ is surely terminated (in moment $t_1$). The isolating pulses $P_i$ have a repetition period $T_p$ and the gating circuit 2 isolates the input of the measuring unit 3 from the measuring circuit 1 accordingly.

As it was explained before, the output of the measuring unit 3 is coupled through the transmission gate 4 to the input of the synchronous detector 5. The measuring unit 3 has a predetermined characteristic regeneration time $\tau$ (response time) which is typically in the range of some microseconds. When the measuring unit 3 is connected in the moment $t_2$ to the measuring circuit 1, a switching transient will occur in the output thereof. In order to prevent the average-formation process carried out by the synchronous detector 5 to be disturbed by this transient, the path between the output of the measuring unit 3 and the input of the synchronous detector 5 will be broken by means of blocking the signal passage through the transmission gate 4. This path-breaking occurs during a dead period $T_H$ following the termination of every control pulse $P_c$. Naturally, the transmission gate 4 is blocked during the presence of the exciting pulse $P_g$, too. From this way of operation, it follows that the duration $T_T$ of pulse $P_{Tr}$ controlling the blocking condition of the transmission gate 4 (diagram 1b.) is defined by the equation: $T_T = T_g + T_H$.

The value of the dead period $T_H$ is chosen to be a predetermined constant portion of the period time $T_p$ as it is explained in the published U.S. Pat. No. 4,437,060 referred to hereinabove.

The terminating moment $t_3$ of the pulse $P_{Tr}$ will therefore be delayed by a constant phase angle relative to the terminating moment $t_1$ of the corresponding exciting pulse $P_g$ at any adjusted value of the period time $T_p$. According to a characteristic feature of the present invention, the pulse $P_{Tr}$ is generated when a time equal to the repetition period $T_p$ has elapsed following the starting moment $t_o$, which pulse $P_{Tr}$ is adapted to block again the passage through the transmission gate 4.

Diagram 1e. in FIG. 1 shows a gated response signal $S_R$ coupled through the transmission gate 4 to the input of the synchronous detector 5. In moment $t_3$, the transmission gate 4 is turned on and a decaying transient response signal is coupled to the input of the synchronous detector 5. This signal corresponds to the output of the measuring circuit 1 produced in response to the exciting pulse $P_g$ started in the moment $t_o$. In moment $t_4$, the passage through the transmission gate 4 is broken again for a duration $T_T$, and the corresponding isolating pulse $P_i$ releases the gating circuit 2 to disconnect the input of the measuring unit 3 from the measuring circuit 1. Apart from the fact that no exciting pulse is started in this moment $t_4$, all events are repeated in the moment $t_4$ which took place in the moment $t_o$.

In order to provide a continuously existing signal in the input of the synchronous detector 5 during the off-condition of the transmission gate 4, a track-and-hold or a sample-and-hold circuit is used for the storage of the last significant output of the transmission gate 4 preceding the moment $t_4$ and this stored signal is coupled during this off-period to the input of the synchronous detector 5. The dashed sections in diagrom 1e. show this simulated value $S_s$ of the measuring signal.

The synchronous detector 5 has a reference input 51 which receives a symmetrical rectangular synchronizing pulse $P_L$ that is started in the moment $t_3$ and has a repetition period of $2T_p$. Under control of the synchronizing pulse $P_L$, the synchronous detector 5 provides the weighted integral of the measuring signal $S_R$, i.e., it subtracts the mean value generated in the negative period of the synchronizing pulse $P_L$ from the integral generated in the positive period thereof.

The above described way of operation elucidates a basic aspect of the present invention. Between the occurrence of two subsequent exciting pulses $P_g$, the switches of the measuring apparatus are operated with double periodicity. During the first operational period, the processes which generate the switching transients occur substantially in the moments $t_2$ and $t_3$, which is followed by a positive average-forming process made by the synchronous detector 5. During the second operational period, the switching transients occur about the moments $t_5$ and $t_6$, which is followed by a negative average-forming by the synchronous detector 5. It is well-known in the art that the transient behavior of a measuring apparatus 2 triggered by a switching operation is defined by the properties of the apparatus and it is largely independent of the parameters of the measured signal. In a complete period of the synchronous detector 5 with the conditions illustrated diagrammatically in FIG. 1, the transient processes take place twice in sequence. The synchronous detector 5 averages the two corresponding responses with opposite signs, whereby the effects of the switching transients on the measurements will balance each-other.

The balanced effect of the switching transients results in a significant increase in zero-line stability and in addition to this increase, the length of the dead periods $T_H$ can be reduced substantially. Whereas the minimum dead period $T_H$ must be about fifteen times as long as the regeneration time $\tau$ of the measuring unit in the apparatus described in the U.S. Pat. No. 4,437,060 referred to hereinabove to ensure that the switching transients can not exert a non-negligable influence on the measurements, in the present invention, however, it is sufficient if the condition $T_H = \tau$ is met. Due to the substantial reduction of the dead period $T_H$, the range for adjustment of the repetition period $T_p$ will be increased from the earlier 3 orders of magnitude to 4.5 orders of magnitude, whereby the possibilities for carrying out the measurements are largely enhanced. The reduction of the dead period $T_H$ results in a corresponding increase in the actual detecting periods which is connected with increased sensitivity.

The time-diagrams of FIG. 1 show a pair of regions I and II. The above described way of operation is characteristic to region I. The pulses shown between the moments $t_o$ and $t_6$ might go on repeatedly after the moment $t_6$.

Let us suppose that in moment $t_7$ which designates the beginning of the region II, the same pulses are generated as in the moment $t_o$ in region I. Thus, the moment $t_7$ corresponds to the moment $t_o$. Accordingly, in the region II, the following pulses are provided: the control pulse $P_c$, the exciting pulse $P_g$ triggered by the control pulse, the isolating pulse $P_i$, the pulses $P_{Tr}$ for controlling the transmission gate 4, and in response to these pulses the response of the sample provides the response signal $S_R$ that controls the input of the synchronous detector 5. The exciting pulse $P_g$ is terminated in moment $t_8$ and it lasts for the duration $T_g$. This is followed by the dead period $T_H$ which is finished in moment $t_g$. The pulse $P_{Tr}$ lasts for the combined duration $T_T$ of the control pulse $P_c$ and the dead period $T_H$ i.e. until the moment $t_g$. The synchronizing pulse $P_L$ of the synchronous detector 5 is started in the moment $t_g$ and it has a period-time of $2T_p$.

Thus in region II similar events take place as in region I. The substantial functional difference lies in that a second type of control pulse $P_{Cm}$ is started in moment $t_{10}$ when a time of about $T_p$ has elapsed from the starting moment of the exciting pulse $P_g$, and the second control pulse $P_{Cm}$ has a duration of $T_{gm}$. The generation of the second control pulse $P_{Cm}$ is associated with the generation of a corresponding isolating pulse $P_{im}$, of a pulse $P_{Trm}$ for controlling the transmission gate 4 and of a second exciting pulse $P_{gm}$ differing in intensity and/or duration from the first exciting pulse $P_g$.

The conditions for the accurate timing should be established as follows. The second exciting pulse $P_{gm}$ is terminated in moment $t_{11}$. The pulse $P_{Trm}$ should be terminated in moment $t_{12}$ which occurs when a dead period $T_H$ has elapsed following the moment $t_{11}$, and the moment $t_{12}$ should coincide with the middle edge of the synchronizing pulse $P_L$ started in moment $t_g$ and having a period time of $2T_p$. The duration $T_{Tm}$ of the pulse $P_{Trm}$ is determined by the equation $T_{Tm} = T_{gm} + T_H$, in which $T_{gm}$ designates the duration of the second type exciting pulse $P_{gm}$. The starting moment $t_{10}$ for the second exciting pulse $P_{gm}$ should thus be set so as to precede the moment $t_{12}$, which has a fixed phase, by the combined duration of the dead period $T_H$ and the pulse duration $T_{gm}$.

In region II, both the first and second types of the exciting pulses $P_g$ and $P_{gm}$ are generated periodically with respective period times of $2T_p$ so that their relative phase remains constant.

The second type of exciting pulses $P_{gm}$ differs in intensity and/or duration from the first type of exciting pulses $P_g$, and in the example illustrated in FIG. 1 its intensity $I_m$ is smaller and its duration is shorter than the corresponding parameters of the first type of exciting pulses $P_g$. From this it follows that the second response signals $S_{Rm}$ will be smaller than the first ones.

In region II, the response signals $S_R$ and $S_{Rm}$ are repeated alternatively. The synchronous detector 5 is operated in the same way as in region I, therefore the weighted average-forming takes place just as it was described in connection with region I. The switching transients will again off-set each other and result in the already described advantages. Owing to the presence of the second type exciting pulses $P_{gm}$, however, the physical meaning of the output of synchronous detector 5 will now be different.

The suggested processing of the transient response signals obtained by the two types of loading, in which these signals are integrated and multiplied by the synchronizing pulse $P_L$ as a weighting function, offers measurement possibilities similar to those offered by the widely known double correlation DLTS or DDLTS method. An advantageous difference between the two methods lies in that in the present invention the integration period covers the full existence of the response signal and it is not limited to discrete short time-windows as in the DDLTS technique. The application of longer integration periods results in a higher sensitivity and in better signal to noise ratio. The considerations for the adjustment of the dead period $T_H$ described in connection with region I, are also valid in region II, since the respective recovery sections (following the moments $t_9$ and $t_{12}$) that take place after the switching transients, are weighted with opposite signs.

This method in which the respective response signals triggered by the two types of exciting pulses are weighted with opposite sign offers a possibility for determining the spatial distribution of deep level concentration, if the duration of both types of exciting pulses $P_g$ and $P_{gm}$ are set to be equal and their relative intensity is changed.

With identical intensities and different durations, the measurement output is proportional to the capture cross section ratio. Reference is made now again to FIG. 2 in which the apparatus for carrying out the method is shown.

As it was described earlier, the sample which is to be measured is connected in the measuring circuit 1. The output of the measuring circuit 1 is coupled through the gating circuit 2 to the input of the measuring unit 3 and the output of this latter is connected to the input of the transmission gate 4. The transmission gate 4 comprises a first gate 41, a track-and-hold circuit 42 with an input coupled to the output of the first gate 41 and a second gate 43 controlled inversely relative to the first gate 41. The second gate 43 has a first input coupled to the output of the track-and-hold circuit 42 and a second input coupled to the input of the first gate 41. The output of the second gate 43 delivers the response signal $S_R$ and it is coupled to the input of the synchronous detector 5.

The exciter 6 provides for the pulse-like excitation of the sample in the measuring circuit 1 in accordance with control commands delivered by the control unit 7 adapted to control and synchronize the operation of the various units of the apparatus. The clock 8 is used to deliver appropriate clock pulses to the control unit 7. An embodiment of the apparatus described heretofore is illustrated in FIGS. 1 and 2 of the U.S. Pat. No. 4,437,060 referred to hereinabove.

In the improvement according to the present invention, a frequency divider 9 is inserted in the path between output 71 of the control unit 7 and synchronizing input 51 of the synchronous detector 5. The frequency divider 9 halves the input frequency and delivers the synchronizing pulses $P_L$ for the synchronous detector 5. The control unit 7 has an output 72 supplying the pulses $P_{Tr}$. This output 72 is coupled directly to the control input of the first gate 41 and through an inverter 10 to the control input of the second gate 43, whereby the inverted operation of the two gates is assured.

The gating circuit 2 is adapted to isolate the output of the measuring circuit 1 from the input of the measuring unit 3 for the duration $T_g$ of the excitation and for a short delay period of some nanoseconds following the excitation. This can be done e.g. by grounding the input of the measuring unit 3 and disconnecting the output line of the measuring circuit. The gating circuit 2 has a control input coupled to output 73 of the control unit 7 to receive the isolating pulses $P_i$ therefrom.

The exciter 6 comprises first and second pulse generators 61 and 62. The first pulse generator 61 has a first input 611 coupled to output 74 of the control unit 7 to receive the control pulses $P_c$ shown in FIG. 1. The first pulse generator 61 has a second inhibiting input 612 coupled to output 75 of the control unit 7 receive the blocking pulses $P_N$. During the presence of the blocking pulses $P_N$ the first pulse generator 61 can not generate pulses.

The second pulse generator 62 is adapted to provide the second type exciting pulses $P_{gm}$, of course in the mode of operation corresponding to region II. The second pulse generator 62 has a control input 621 coupled to output 76 of the control unit 7 to receive the second type of control pulses $P_{cm}$.

The operation of the apparatus according to the invention corresponds to the method illustrated in diagrams of FIG. 1.

A setting means, not shown in the drawing, provides for the appropriate setting of the parameters of the control unit 7 i.e. to operate in the first or second modes (region I or II) including the setting of the clock frequency and the duration of the exciting pulses.

If the apparatus shown in FIG. 2 is compared to conventional ones used for performing the DDLTS method, then its simple design will be apparent. The multi-channel signal processing and the several times repeated analog operations used in such known devices decreases both the signal to noise ratio and the sensitivity. Such effects can not take place in the apparatus according to the invention. According to practical tests carried out with the apparatus shown in FIG. 2, it is capable of detecting transient capacitance changes as small as $10^{-5}$ pF.

We claim:

1. In a method for determining charged energy states of a sample of a semiconductor or insulator material by using deep level transient spectroscopy, having the steps of exciting said sample by the application of periodical exciting pulses to change the initial charge state thereof, detecting the transient response of said sample when it returns to the thermodynamical balance condition following the termination of each of said excitation pulses, blocking said detection during a blocking period defined as the combined existence of said exciting pulses and of a dead period including the recovery period of the means used for the detection, performing a weighted integration operation on a detected response signal by the application of a symmetrical square wave synchronizing pulse as a weighting function synchronized to the frequency of said exciting pulses, the improvement comprising the additional steps of synchronizing said synchronizing pulses to terminating moments of said dead periods to have a period time which is equal to the period time of said periodical exciting pulses and additionally blocking said detection in each of said detection periods for the duration of a further blocking period having the same length as said blocking period and terminating in moments when said synchronizing pulses are reversed between two consecutive ones of said terminating moments, said detected respones signal in said blocking periods and further blocking periods being substituted by a simulated signal for said weighted integration operation which has a value equal to that of said detected response signal immediately preceding the starting moment of said blocking period or further blocking period.

2. The method as claimed in claim 1, wherein a synchronous detector is used for the weighted integration, and the synchronizing pulse forming the weighting function is coupled to a reference input of the synchronous detector.

3. The method as claimed in claim 1, in which said dead period is adjusted to be a predetermined constant portion of the period time of said exciting pulses.

4. In a method for determining charged energy states of a sample of a semiconductor or insulator material by using deep level transient spectroscopy, having the steps of exciting said sample by the application of periodical exciting pulses to change the initial charge state thereof, detecting the transient response of said sample when it returns to the thermodynamical balance condition following the termination of each of said excitation pulses, blocking said detection during a blocking period defined as the combined existence of said exciting pulses and of a dead period including the recovery period of the means used for the detection, performing a weighted integration operation on a detected response signal by the application of a symmetrical square wave synchronizing pulse as a weighting function synchronized to the frequency of said exciting pulses, the improvement comprising the additional steps of synchronizing said synchronizing pulses to terminating moments of said dead periods to have a period time which is equal to the period time of said periodical exciting pulses and additionally blocking said detection in each of said detection periods for the duration of a further blocking period and terminating in moments when said synchronizing pulses are reversed between two consecutive ones of said terminating moments, said detected response signal in said blocking periods and further blocking periods being substituted by a simulated signal for said weighted integration operation which has a value equal to that of said detected response signal immediately preceding the starting moment of said blocking periods or further blocking period, exciting said sample additionally by second type exciting pulses during said further blocking periods occurring between said first exciting pulses and the second type exciting pulses having a different intensity and/or duration than said first exciting pulses and the length of said further blocking periods is adjusted to the combined duration of the second type exciting pulses and of the dead period.

5. The method as claimed in claim 4, in which said dead period is adjusted to be a predetermined constant portion of the period time of said exciting pulses.

6. The method as claimed in claim 4, wherein a synchronous detector is used for the weighted integration, and the synchronizing pulse forming the weighting function is coupled to a reference input of the synchronous detector.

7. Apparatus for carrying out a method for determining charged energy states of a sample of a semiconductor or insulator material by using deep level transient spectroscopy, the method including the steps of exciting said sample by applying periodical exciting pulses to change an initial charge state thereof, detecting a transient response of said sample when it returns to a thermodynamical balance condition following termination of each of said exciting pulses, blocking said detection during a blocking period defined as the combined existence of said exciting pulses and of a dead period including the recovery period of a means used for the detection, performing a weighted integration operation on a detected response signal by applying a symmetrical square wave synchronizing pulse as a weighting function synchronized to the frequency of said exciting pulses, synchronizing said synchronizing pulses to terminating moments of said dead periods to have a period time which is equal to the period time of said periodical exciting pulses and additionally blocking said detection in each of said detection periods for the duration of a further blocking period having the same length as said blocking period and terminating in moments when said synchronizing pulses are reversed between two consecutive ones of said terminating moments, said detected response signal in said blocking periods and further blocking periods being substituted by a simulated signal for said weighted integration operation which has a value equal to that of said detected response signal immediately preceding the starting moment of said blocking period or further blocking period, comprising a measuring circuit with the sample to be examined, an exciter coupled to said measuring circuit, a measuring unit for detecting a response of said measuring circuit, a gating circuit coupled between the output of said measuring circuit and the input of said measuring unit, a transmission gate coupled to the output of said measuring unit, a synchronous detector with an input coupled to the output of said transmission gate, a control unit and a clock coupled to said control unit, said control unit including outputs delivering pulses synchronized to said clock, a first of said outputs is coupled to an input of said exciter to define exciting pulses, a second output is coupled to said gating circuit to block the measurement during the exciting pulses and short subsequent transient periods, a third output is coupled to said transmission gate to block the passage of signals therethrough during said exciting pulses and subsequent dead periods, in which said dead periods having a length forming a predetermined small portion of the period time of said exciting pulses, and including a frequency divider with a dividing ratio of 1:2 having an input coupled to an output of said control unit delivering clock pulses synchronized to the end moments of said dead periods and an output coupled to a reference input of said synchronous detector, said control unit comprising a fourth output coupled to an inhibiting input of said exciter to block the generation of every second exciting pulse.

8. The apparatus as claimed in claim 7, wherein said exciter comprises a first and a second pulse generator, the first pulse generator has inputs for receiving outputs of said control unit which control generation and inhibition of first type exciting pulses and the second pulse generator has an input for triggering the generation of second type exciting pulses being different from the first type exciting pulses which is coupled to a further output of said control unit to determine the occurrence of triggering moments.

9. The apparatus as claimed in claim 8, in which said transmission gate comprises a track-and-hold or a sample-and-hold circuit having an input coupled to the input of said transmission gate and an output which in a blocked state of the transmission gate is coupled to an output thereof.

10. Apparatus for carrying out a method for determining charged energy states of a sample of a semiconductor or insulator material by using deep level transient spectroscopy, the method including the steps of exciting said sample by applying periodical exciting pulses to change an initial charge state thereof, detecting a transient response of said sample when it returns to a thermodynamical balance condition following termination of each of said exciting pulses, blocking said detection during a blocking period defined as the combined existence of said exciting pulses and of a dead period including the recovery period of a means used for the detection, performing a weighted integration operation on a detected response signal by applying a symmetrical square wave synchronizing pulse as a weighting function synchronized to the frequency of said exciting pulses, synchronizing said synchronizing pulses to terminating moments of said dead periods to have a period time which is equal to the period time of said periodical exciting pulses and additionally blocking said detection in each of said detection periods for the duration of a further blocking period and terminating in moments when said synchronizing pulses are reversed between two consecutive ones of said terminating moments, said detected response signal in said blocking periods and further blocking periods being substituted by a simulated signal for said weighted integration operation which has a value equal to that of said detected response signal immediately preceding the starting moment of said blocking period or further blocking period, exciting said sample additionally by second type exciting pulses during said further blocking periods occurring between said first exciting pulses and the second type exciting pulses having a different intensity and/or duration than said first exciting pulses and the length of said further blocking periods is adjusted to the combined duration of the second type exciting pulses and of the dead period comprising a measuring circuit with the sample to be examined, an exciter coupled to said measuring circuit, a measuring unit for detecting a response of said measuring circuit, a gating circuit coupled between the output of said measuring circuit and the input of said measuring unit, a transmission gate coupled to the output of said measuring unit, a synchronous detector with an input coupled to the output of said transmission gate, a control unit and a clock coupled to said control unit, said control unit including outputs delivering pulses synchronized to said clock, a first of said outputs is coupled to an input of said exciter to define exciting pulses, a second output is coupled to said gating circuit to block the measurement during the exciting pulses and short subsequent transient periods, a third output is coupled to said transmission gate to block the passage of signals therethrough during said exciting pulses and subsequent dead periods, in which said dead periods having a length forming a predetermined small portion of the period time of said exciting pulses, and including a frequency divider with a dividing ratio of 1:2 having an input coupled to an output of said control unit delivering clock pulses synchronized to the end moments of said dead periods and an output coupled to a reference input of said synchronous detector, said control unit comprising a fourth output coupled to an inhibiting input of said exciter to block the generation of every second exciting pulse.

11. The apparatus as claimed in claim 10, wherein said exciter comprises a first and a second pulse generator, the first pulse generator has inputs for receiving output of said control unit which control generation and inhibition of first type exciting pulses and the second pulse generator has an input for triggering the generation of second type exciting pulses being different from the first type exciting pulses which is coupled to a further output of said control unit to determine the occurrence of triggering moments.

12. The apparatus as claimed in claim 11, in which said transmission gate comprises a track-and-hold or a sample-and-hold circuit having an input coupled to the input of said transmission gate and an output which in a blocked state of the transmission gate is coupled to an output thereof.

* * * * *